(12) United States Patent
Herrmann et al.

(10) Patent No.: US 9,179,507 B2
(45) Date of Patent: Nov. 3, 2015

(54) LIGHTING APPARATUS

(75) Inventors: Siegfried Herrmann, Neukirchen (DE); Norwin Von Malm, Nittendorf (DE); Lutz Höppel, Alteglofsheim (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 313 days.

(21) Appl. No.: 13/821,551

(22) PCT Filed: Jul. 25, 2011

(86) PCT No.: PCT/EP2011/062741
§ 371 (c)(1),
(2), (4) Date: May 17, 2013

(87) PCT Pub. No.: WO2012/031823
PCT Pub. Date: Mar. 15, 2012

(65) Prior Publication Data
US 2013/0229793 A1   Sep. 5, 2013

(30) Foreign Application Priority Data

Sep. 10, 2010 (DE) .......................... 10 2010 045 054

(51) Int. Cl.
| | |
|---|---|
| *H05B 37/00* | (2006.01) |
| *H05B 33/08* | (2006.01) |
| *H01L 41/04* | (2006.01) |
| *H01L 41/107* | (2006.01) |
| *F21L 13/06* | (2006.01) |

(52) U.S. Cl.
CPC ............... *H05B 33/08* (2013.01); *F21L 13/06* (2013.01); *H01L 41/044* (2013.01); *H01L 41/107* (2013.01); *H05B 33/0809* (2013.01)

(58) Field of Classification Search
None
See application file for complete search history.

(56) References Cited

U.S. PATENT DOCUMENTS

| | | | |
|---|---|---|---|
| 2007/0024254 A1 | 2/2007 | Radecker et al. | |
| 2009/0261740 A1 | 10/2009 | Cheng et al. | |
| 2013/0134881 A1* | 5/2013 | Von Malm et al. | 315/113 |
| 2014/0145610 A1* | 5/2014 | Rode et al. | 315/70 |

FOREIGN PATENT DOCUMENTS

| | | |
|---|---|---|
| DE | 102005025623 A1 | 12/2006 |
| DE | 102008051044 A1 | 4/2010 |
| DE | 102009056386 A1 | 6/2011 |
| DK | 176870 B1 | 2/2010 |
| WO | 2010/034277 A1 | 4/2010 |
| WO | 2010/097407 A1 | 9/2010 |

* cited by examiner

*Primary Examiner* — Cassandra Cox
(74) *Attorney, Agent, or Firm* — McDermott Will & Emery LLP

(57) ABSTRACT

What is specified is: a lighting apparatus, with a piezoelectric transformer (1), which has a mounting face (10), on which at least two output-side connection points (11) are arranged, and at least one substrateless light-emitting diode (2), which is designed to generate electromagnetic radiation, wherein the at least one substrateless light-emitting diode (2) is fitted at least indirectly to the mounting face (10) and fastened mechanically to the mounting face (10), and the at least one substrateless light-emitting diode (2) is electrically conductively connected to at least two of the output-side connection points (11).

13 Claims, 3 Drawing Sheets

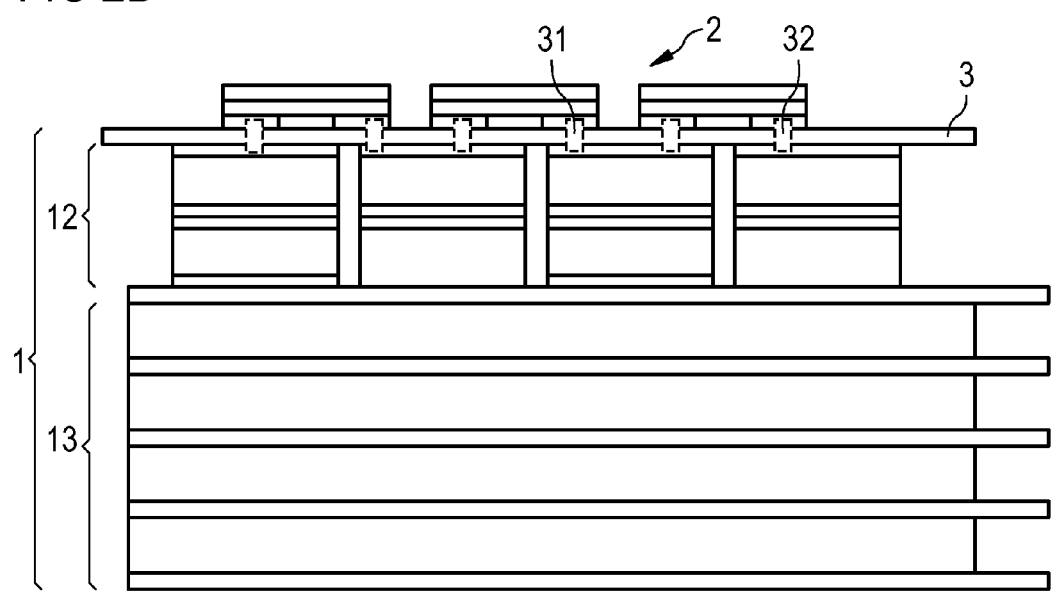

LIGHTING APPARATUS

Figure 1:
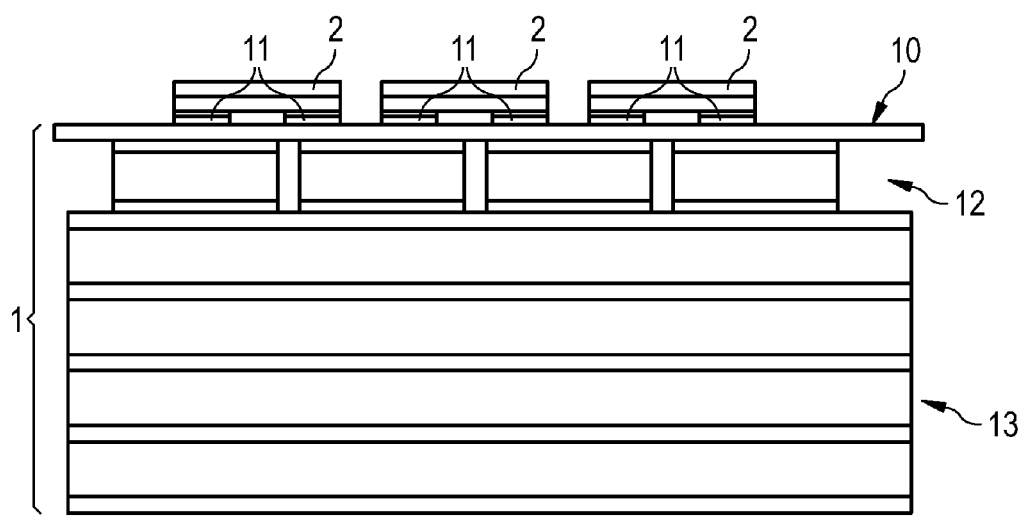

A lighting apparatus is specified.

One object to be achieved is to specify a lighting apparatus which has particularly small geometrical dimensions and a particularly low weight.

In accordance with at least one embodiment of the lighting apparatus, the lighting apparatus comprises a piezo-transformer. In comparison with a magnetically operating transformer, for example, a piezo-transformer is distinguished by its high efficiency and its small volume. The piezo-transformer contains or consists of at least one ceramic material. In particular, the piezo-transformer can contain a lead zirconate titanate (PZT) as ceramic material. Furthermore, it is possible for the piezo-transformer to be free of heavy metals. Piezo-transformers are described for example in the documents DK 176870 B1 and US 2007/0024254 A1, the disclosure content of which is hereby expressly incorporated by reference.

The piezo-transformer has a mounting face. A further component of the lighting apparatus can be fixed to the mounting face of the piezo-transformer. At least two output-side connection locations are arranged at the mounting face of the piezo-transformer. At the output-side connection locations, the piezo-transformer makes available electric current and voltage for operating a component of the lighting apparatus which is to be connected to the output-side connection locations. The connection locations can be embodied for example as metallizations at the mounting face of the piezo-transformer.

In accordance with at least one embodiment of the lighting apparatus, the lighting apparatus comprises at least one substrateless luminescence diode. In the present case, a luminescence diode is understood to be a light-emitting diode or a laser diode which generates electromagnetic radiation for example in the wavelength range between UV radiation and infrared radiation during operation. By way of example, the substrateless luminescence diode is designed for emitting light in the visible spectral range.

"Substrateless" means that the luminescence diode has no growth substrate. That is to say that a growth substrate onto which semiconductor layers forming a semiconductor body of the luminescence diode are deposited epitaxially, for example, is removed from the semiconductor body of the luminescence diode. The substrateless luminescence diode is thus free of a growth substrate. Furthermore, the substrateless luminescence diode is preferably free of a carrier body. That is to say that the substrateless luminescence diode consists, for example, exclusively of an epitaxially grown semiconductor body, on which can be arranged metallizations for connection and at least one passivation layer for electrical insulation in places.

In accordance with at least one embodiment of the lighting apparatus, the at least one substrateless luminescence diode is at least indirectly applied to the mounting face of the piezo-transformer and mechanically fixed to the mounting face. In this case, "at least indirectly" means that, for example, an intermediate carrier can be situated between the luminescence diode and the mounting face of the piezo-transformer. The at least one substrateless luminescence diode can then be mechanically fixed to the mounting face via the intermediate carrier. The at least one substrateless luminescence diode is furthermore electrically conductively connected to at least two of the output-side connection locations.

In other words, the at least one substrateless luminescence diode is supplied, via the at least two output-side connection locations, with the voltage necessary for its operation and with the electrical current necessary for its operation. In this case, the at least one substrateless luminescence diode can be indirectly electrically conductively connected to at least two of the output-side connection locations, that is to say that, for example, conductor tracks can be situated between the substrateless luminescence diode and the output-side connection locations. Furthermore, it is possible for the substrateless luminescence diode to be directly electrically conductively connected to at least two of the output-side connection locations; by way of example, the substrateless luminescence diode can then be soldered or electrically conductively adhesively bonded to the output-side connection locations.

In accordance with at least one embodiment of the lighting apparatus, the lighting apparatus comprises a piezo-transformer having a mounting face, at which at least two output-side connection locations are arranged, and at least one substrateless luminescence diode designed for generating electromagnetic radiation. In this case, the at least one substrateless luminescence diode is at least indirectly applied to the mounting face and mechanically fixed to the mounting face. The at least one substrateless luminescence diode is electrically conductively connected to at least two of the output-side connection locations.

In this case, a lighting apparatus described here is based on the following insight, inter alia: the use of a piezo-transformer as carrier element for the at least one substrateless luminescence diode results in a lighting apparatus having particularly small geometrical dimensions. By way of example, the use of a piezo-transformer with a substrateless luminescence diode leads to a lighting apparatus having a particularly small thickness. Such a lighting apparatus is particularly well-suited to use as luminous means for example in general lighting. By way of example, in this way it is possible to form extremely thin luminous tiles (so-called LED panels) which for example are also suitable as floor, ceiling or wall covering in the sense of tiles.

The lighting apparatus can comprise exactly one substrateless luminescence diode, at least two substrateless luminescence diodes, preferably a plurality of substrateless luminescence diodes. In this case, the lighting apparatus then preferably has a single piezo-transformer, which makes available electric current and voltage for all the luminescence diodes of the lighting apparatus.

In accordance with at least one embodiment of the lighting apparatus, the at least one substrateless luminescence diode is directly applied to the mounting face. That is to say that no further component of the lighting apparatus, such as, for example, an intermediate carrier, is arranged between the piezo-transformer and the at least one substrateless luminescence diode. By way of example, metal layers serving for the interconnection and fixing of the substrateless luminescence diode are applied to the mounting face.

Since substrateless luminescence diodes are distinguished in particular by their very small thickness and have a relatively high mechanical flexibility on account of the absence of a substrate or carrier, the oscillation behavior of the piezo-transformer is hardly influenced adversely or not influenced adversely at all by the substrateless luminescence diodes directly applied to the mounting face. The at least one substrateless luminescence diode can be for example electrically conductively adhesively bonded or soldered to the output-side connection locations of the piezo-transformer.

In accordance with at least one embodiment of the lighting apparatus, an intermediate carrier is arranged between the at least one substrateless luminescence diode and the mounting face of the piezo-transformer, wherein the intermediate carrier comprises contact locations and the at least two output-side connection locations and the at least one substrateless luminescence diode are electrically conductively connected to the contact locations. In other words, the intermediate carrier imparts an electrically conductive connection between the at least one substrateless luminescence diode and the piezo-transformer. The intermediate carrier can be, for example, a board in the manner of a printed circuit board, wherein the intermediate carrier, alongside the contact locations, can also have electrical conductor tracks, for example, which electrically conductively connect contact locations of the intermediate carrier to one another. In this case, the intermediate carrier can have a main body formed with silicon or a ceramic material, for example. The contact locations and, if appropriate, the conductor tracks are then structured in and/or on the main body. The use of an intermediate carrier entails the disadvantage that the oscillating behavior of the piezo-transformer is altered to a greater extent than if no intermediate carrier is present. This disadvantage can be kept small by the use of a particularly thin intermediate carrier. On the other hand, the intermediate carrier affords further design possibilities since, for example, electrically passive components serving for protection or for driving of the at least one substrateless luminescence diode can be integrated into the intermediate carrier.

By way of example, the lighting apparatus comprises a plurality of substrateless luminescence diodes. All the substrateless luminescence diodes of the lighting apparatus are then applied on the top side of the intermediate carrier facing away from the piezo-transformer. That is to say that the lighting apparatus in this case comprises a single intermediate carrier, a single piezo-transformer and at least one, preferably a multiplicity of substrateless luminescence diodes.

In accordance with at least one embodiment of the lighting apparatus, the intermediate carrier has at least one plated-through hole extending from an underside of the intermediate carrier facing the piezo-transformer to a top side of the intermediate carrier facing away from the piezo-transformer, wherein the plated-through hole electrically conductively connects an output-side connection location of the piezo-transformer to at least one of the substrateless luminescence diodes. That is to say that an electrically conductive connection between the underside of the intermediate carrier, facing the piezo-transformer, and the top side of the intermediate carrier, at which the at least one substrateless luminescence diode is situated, can be produced by means of a plated-through hole extending through a main body of the intermediate carrier. In this way, large-area metallizations which are formed at the outer surface of the intermediate carrier and are intended to serve for connecting the underside and top side can be avoided.

In accordance with at least one embodiment, the intermediate carrier comprises at least one passive electrical component. By way of example, the passive electrical component is an electrical resistor, an ESD protective component such as, for example, an ESD protective diode or a varistor and/or a photodiode.

In this case, the at least one passive electrical component can be integrated into a main body of the intermediate carrier, such that the component does not project at the outer surfaces of the intermediate carrier, and the thickness of the lighting apparatus is therefore not increased by the passive electrical component. By way of example, the intermediate carrier can comprise an ESD protective component that forms protection for the at least one substrateless luminescence diode against electrostatic discharge. In this case, for each substrateless luminescence diode, a uniquely assigned ESD protective component can be present in the intermediate carrier. By way of example, the ESD protective component can be embodied as an ESD protective diode formed by corresponding local doping of the intermediate carrier. For this purpose, the intermediate carrier can have for example a main body consisting of a semiconductor material such as silicon.

Furthermore, it is possible for the intermediate carrier to comprise at least one photodiode wherein the photodiode is designed to detect electromagnetic radiation generated by the at least one substrateless luminescence diode during operation. Such a photodiode can be used for example to monitor the functionality of the substrateless luminescence diode during the operation of the lighting apparatus. Alternatively or additionally, it is possible for the photodiode to be designed to detect the ambient brightness and, by means of the photodiode, for the lighting apparatus to be switched on in the case of a specific ambient brightnesses being undershot.

In accordance with at least one embodiment of the lighting apparatus, the at least one substrateless luminescence diode has a thickness of at most 10 µm, in particular of 6 µm. Such a thin substrateless luminescence diode is distinguished by its low weight and its high mechanical flexibility. With an intermediate carrier being dispensed with, such a substrateless luminescence diode hardly alters or does not alter the oscillating behavior of the piezo-transformer.

In accordance with at least one embodiment of the lighting apparatus, the intermediate carrier has a thickness of at most 150 µm. Such a thin intermediate carrier also ensures that the oscillating behavior of the piezo-transformer is adversely influenced only to a small extent. By way of example, the intermediate carrier has a thickness of at least 50 µm. This ensures a sufficient mechanical stability of the intermediate carrier.

In accordance with at least one embodiment of the lighting apparatus, the at least one substrateless luminescence diode and/or the intermediate carrier mechanically oscillate(s) with the same frequency as an output part of the piezo-transformer during the operation of the lighting apparatus. In this case, the piezo-transformer has for example an input part and an output part. The input part and the output part of the piezo-transformer are mechanically coupled to one another and electrically isolated from one another. An electrical input signal is converted into mechanical oscillations in the input part of the piezo-transformer. On account of the mechanical coupling of the input part and the output part, both parts are affected by the mechanical oscillation.

In this case, the conversion of the electrical energy into the mechanical oscillation takes place on account of the inverse piezoelectric effect. In the output part, the mechanical oscillations are converted back into an electrical signal on account of the direct piezoelectric effect. Preferably, the substrateless luminescence diodes and/or the intermediate carrier, on account of the small thickness thereof, can be connected to the output part of the piezo-transformer in such a way that they mechanically oscillate with the same frequency as the output part of the piezo-transformer. That is to say that, on account of the flexibility of the at least one substrateless luminescence diode and/or of the intermediate carrier, a mechanical decoupling with respect to the output part of the piezo-transformer is not necessary. Therefore, it is possible to dispense, in particular, with oscillation-damping measures between the components mentioned.

The lighting apparatus described here is explained in greater detail below on the basis of exemplary embodiments and the associated figures.

Figure 2A:
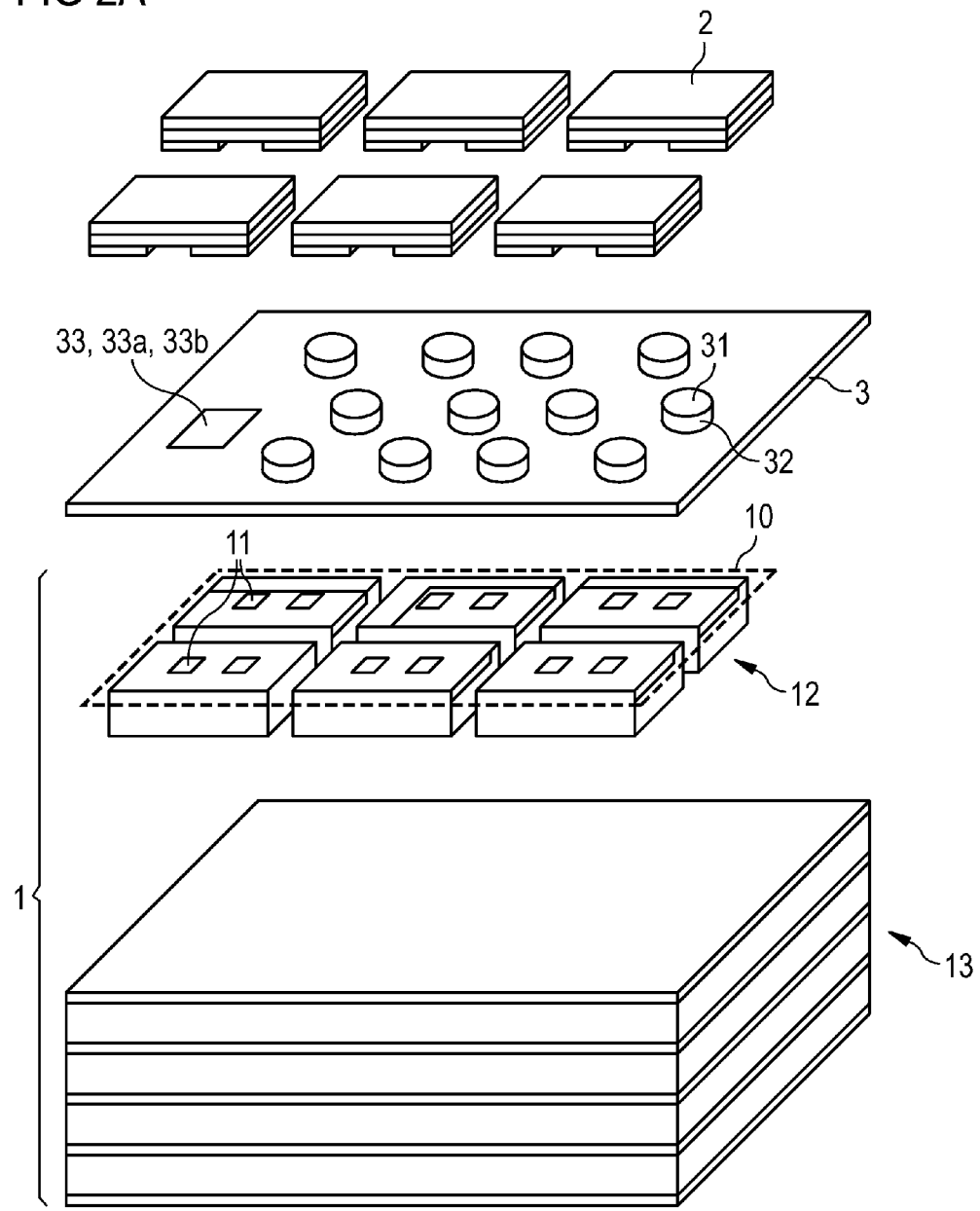

FIGS. 1, 2A, 2B show schematic views of lighting apparatuses described here.

Elements that are identical, of identical type or act identically are provided with the same reference signs in the figures.

The figures and the size relationships of the elements illustrated in the figures among one another should not be regarded as to scale. Rather, individual elements may be illustrated with an exaggerated size in order to enable better illustration and/or in order to afford a better understanding.

FIG. 1 shows a schematic sectional illustration of a lighting apparatus described here. The lighting apparatus comprises a piezo-transformer 1. The piezo-transformer 1 comprises an input part 13 and an output part 12. The output part 12 comprises, for example, a plurality of ceramic bodies applied in an alternately inverted manner (that is to say that the top side and the underside are alternately interchanged) on the input part 13, which is formed with a single ceramic body. At the side facing away from the input part 13, the output part 12 has a separating ceramic comprising, at its side facing away from the input part 13, the mounting face 10 with the output-side connection locations 11.

Substrateless luminescence diodes 2, in the present case substrateless light-emitting diodes, are applied and also mechanically and electrically conductively fixed to the output-side connection locations 11.

In the present case, therefore, the piezo-transformer 1 forms the carrier for the substrateless light-emitting diodes 2. The lighting apparatus can be made particularly thin in this way. The luminescence diodes 2 are directly applied to the mounting face 10.

FIG. 2A shows a schematic exploded illustration of a further exemplary embodiment of a lighting apparatus described here. FIG. 2B shows the associated schematic sectional view.

In contrast to the exemplary embodiment in FIG. 1, the lighting apparatus in this exemplary embodiment has an intermediate carrier 3. The intermediate carrier 3 is formed with silicon, for example. That is to say that the intermediate carrier 3 has a main body consisting of silicon. The intermediate carrier 3 is mechanically fixed to the mounting face 10 of the piezo-transformer 1. Plated-through holes 32, which extend through the main body of the intermediate carrier 3 and are formed with a metal, for example, are electrically conductively connected to the output-side connection locations 11. The plated-through holes 32 have contact locations 31 at their end faces. The substrateless light-emitting diodes 2 are electrically conductively connected to the contact locations 31 at the top side of the intermediate carrier 3 facing away from the piezo-transformer 1. The output-side connection locations 11 of the piezo-transformer are electrically conductively connected to contact locations 31 (not illustrated) at the underside of the intermediate carrier 3 facing the piezo-transformer.

The intermediate carrier 3 furthermore comprises at least one electrically passive component such as, for example, an ESD protective component 33a and/or a photodiode 33b. In this case, the electrically passive component 3 can be integrated into the main body of the intermediate carrier 3.

In other words, the component does not project beyond the main body of the intermediate carrier 3, such that the intermediate carrier 3 is embodied as a board having a homogeneous thickness. By way of example, the thickness of the intermediate carrier 3 is at most 150 μm. The thickness of the substrateless luminescence diodes 2 is at most 6 μm, for example. On account of the mechanical flexibility of the intermediate carrier 3 and the substrateless light-emitting diodes 2 it is not necessary to mechanically decouple these components from the piezo-transformer 1. Therefore, they mechanically oscillate concomitantly with the output part 12 of the piezo-transformer 1.

The figures in each case illustrate a piezo-transformer 1 having a parallelepipedal construction. In a modification of this shaping, the piezo-transformer 1 can also have any other forms desired. By way of example, the piezo-transformer 1 can be embodied in a cylindrical fashion, in the shape of a truncated cone, in a ring-shaped fashion or as a polygon.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

This patent application claims the priority of German Patent Application 10 2010 045 054.5, the disclosure content of which is hereby incorporated by reference.

The invention claimed is:

1. A lighting apparatus comprising:
a piezo-transformer, having a mounting face, at which at least two output-side connection locations are arranged; and
at least one substrateless luminescence diode designed for generating electromagnetic radiation,
wherein the at least one substrateless luminescence diode is at least indirectly applied to the mounting face and mechanically fixed to the mounting face, and
wherein the at least one substrateless luminescence diode is electrically conductively connected electrically to at least two of the output-side connection locations.

2. The lighting apparatus according to claim 1, wherein the substrateless luminescence diode exclusively consists of an epitaxially grown semiconductor body, on which are arranged metallizations for electrical connection and at least one passivation layer for electrical insulation in places.

3. The lighting apparatus according to claim 1, wherein the at least one substrateless luminescence diode is directly applied to the mounting face.

4. The lighting apparatus according to claim 1, wherein an intermediate carrier is arranged between the at least one substrateless luminescence diode and the mounting face,
wherein the intermediate carrier comprises contact locations, and
wherein the at least two output-side connection location and the at least one substrateless luminescence diode are electrically conductively connected to the contact locations.

5. The lighting apparatus according to claim 4, wherein the intermediate carrier has at least one plated-through hole extending from an underside of the intermediate carrier facing the piezo-transformer to a top side of the intermediate carrier facing away from the piezo-transformer, and
wherein the plated-through hole electrically conductively connects an output-side connection location of the piezo-transformer to at least one of the substrateless luminescence diodes.

6. The lighting apparatus according to claim 4, wherein the intermediate carrier comprises at least one passive electrical component.

7. The lighting apparatus according to claim 4, wherein the intermediate carrier comprises at least one ESD protective component that forms protection for the at least one substrateless luminescence diode against electrostatic discharges.

8. The lighting apparatus according to claim 4, wherein the intermediate carrier comprises at least one photodiode wherein the photodiode is designed to detect electromagnetic radiation generated by the at least one substrateless luminescence diode during operation.

9. The lighting apparatus according to claim 1, wherein the at least one substrateless luminescence diode has a thickness of at most 10 μm.

10. The lighting apparatus according to claim 4, wherein the intermediate carrier has a thickness of at most 150 μm.

11. The lighting apparatus according to claim 4, wherein the at least one substrateless luminescence diode or the intermediate carrier mechanically oscillates with the same frequency as an output part of the piezo-transformer during the operation of the lighting apparatus.

12. The lighting apparatus according to claim 4, wherein the at least one substrateless luminescence diode or the intermediate carrier mechanically oscillates with the same frequency as an output part of the piezo-transformer during the operation of the lighting apparatus.

13. A lighting apparatus comprising:
   a piezo-transformer, having a mounting face, at which at least two output-side connection locations are arranged; and
   at least one luminescence diode designed for generating electromagnetic radiation,
   wherein the at least one luminescence diode is at least indirectly applied to the mounting face and mechanically fixed to the mounting face,
   wherein the at least one luminescence diode is electrically conductively connected to at least two of the output-side connection locations,
   wherein an intermediate carrier is arranged between the at least one luminescence diode and the mounting face,
   wherein the intermediate carrier comprises contact locations,
   wherein the at least two output-side connection locations and the at least one luminescence diode are electrically conductively connected to the contact locations,
   wherein the intermediate carrier has at least one plated-through hole extending from an underside of the intermediate carrier facing the piezo-transformer to a top side of the intermediate carrier facing away from the piezo-transformer, and
   wherein the plated-through hole electrically conductively connects an output-side connection location of the piezo-transformer to at least one of the luminescence diodes.

* * * * *